United States Patent
Ito et al.

(10) Patent No.: US 8,470,421 B2
(45) Date of Patent: Jun. 25, 2013

(54) BIODEGRADABLE RESIN BOTTLE AND METHOD OF PRODUCING THE SAME

(75) Inventors: Takuro Ito, Yokohama (JP); Hiroki Mori, Kawasaki (JP); Hiroshi Nakao, Yokohama (JP); Kazuhiko Yamazaki, Yokohama (JP)

(73) Assignee: Toyo Seikan Kaisha, Ltd., Tokyo (JP)

(*) Notice: Subject to any disclaimer, the term of this patent is extended or adjusted under 35 U.S.C. 154(b) by 834 days.

(21) Appl. No.: 12/598,895

(22) PCT Filed: Jun. 5, 2008

(86) PCT No.: PCT/JP2008/060333
§ 371 (c)(1),
(2), (4) Date: Nov. 4, 2009

(87) PCT Pub. No.: WO2008/149918
PCT Pub. Date: Dec. 11, 2008

(65) Prior Publication Data
US 2010/0140205 A1    Jun. 10, 2010

(30) Foreign Application Priority Data
Jun. 6, 2007 (JP) .................. 2007-150408

(51) Int. Cl.
*B32B 1/02* (2006.01)
*B32B 23/00* (2006.01)

(52) U.S. Cl.
USPC ....... 428/35.7; 428/34.1; 428/34.2; 428/35.9; 428/36.9

(58) Field of Classification Search
USPC ............ 428/34.1, 34.2, 35.7, 35.9, 36.9
See application file for complete search history.

(56) References Cited

U.S. PATENT DOCUMENTS

| | | | | |
|---|---|---|---|---|
| 5,366,508 A | * | 11/1994 | Brekke | 623/23.58 |
| 6,805,931 B2 | * | 10/2004 | Nagashima | 428/36.6 |
| 6,827,972 B2 | | 12/2004 | Darras et al. | |
| 6,919,114 B1 | | 7/2005 | Darras et al. | |
| 7,488,683 B2 | * | 2/2009 | Kobayashi et al. | 438/681 |
| 2005/0151296 A1 | * | 7/2005 | Obuchi et al. | 264/171.13 |
| 2006/0172085 A1 | | 8/2006 | Kobayashi et al. | |

FOREIGN PATENT DOCUMENTS

| | | |
|---|---|---|
| JP | 2001-018290 A | 1/2001 |
| JP | 2005-014966 A | 1/2005 |
| JP | 2005-096269 A | 4/2005 |
| JP | 2006-111967 A | 4/2006 |
| JP | 2006-131306 A | 5/2006 |
| KR | 2005-0114230 A | 12/2005 |

* cited by examiner

*Primary Examiner* — Marc Patterson
(74) *Attorney, Agent, or Firm* — Sughrue Mion, PLLC

(57) ABSTRACT

[Problem] To provide a polylactic acid bottle having a vacuum-evaporated film on the inner surface of the bottle wall, effectively preventing the thermal deformation of the bottle at the time of forming the film and exhibiting excellent barrier property against oxygen and water.

[Means for Solution] A biodegradable resin bottle has a wall formed by a biodegradable resin and a vacuum-evaporated film on an inner surface of the wall by a plasma CVD method, and wherein said vapor-evaporated film exhibits hydrocarbon peaks stemming from CH, $CH_2$ and $CH_3$ in a region of a wave number of 3200 to 2600 $cm^{-1}$ as measured by FT-IR, and per the sum of CH, $CH_2$ and $CH_3$ calculated from the hydrocarbon peaks, a $CH_2$ ratio is not larger than 35% and a $CH_3$ ratio is not smaller than 40%.

7 Claims, 1 Drawing Sheet

RESULTS OF FT-IR ANALYSIS

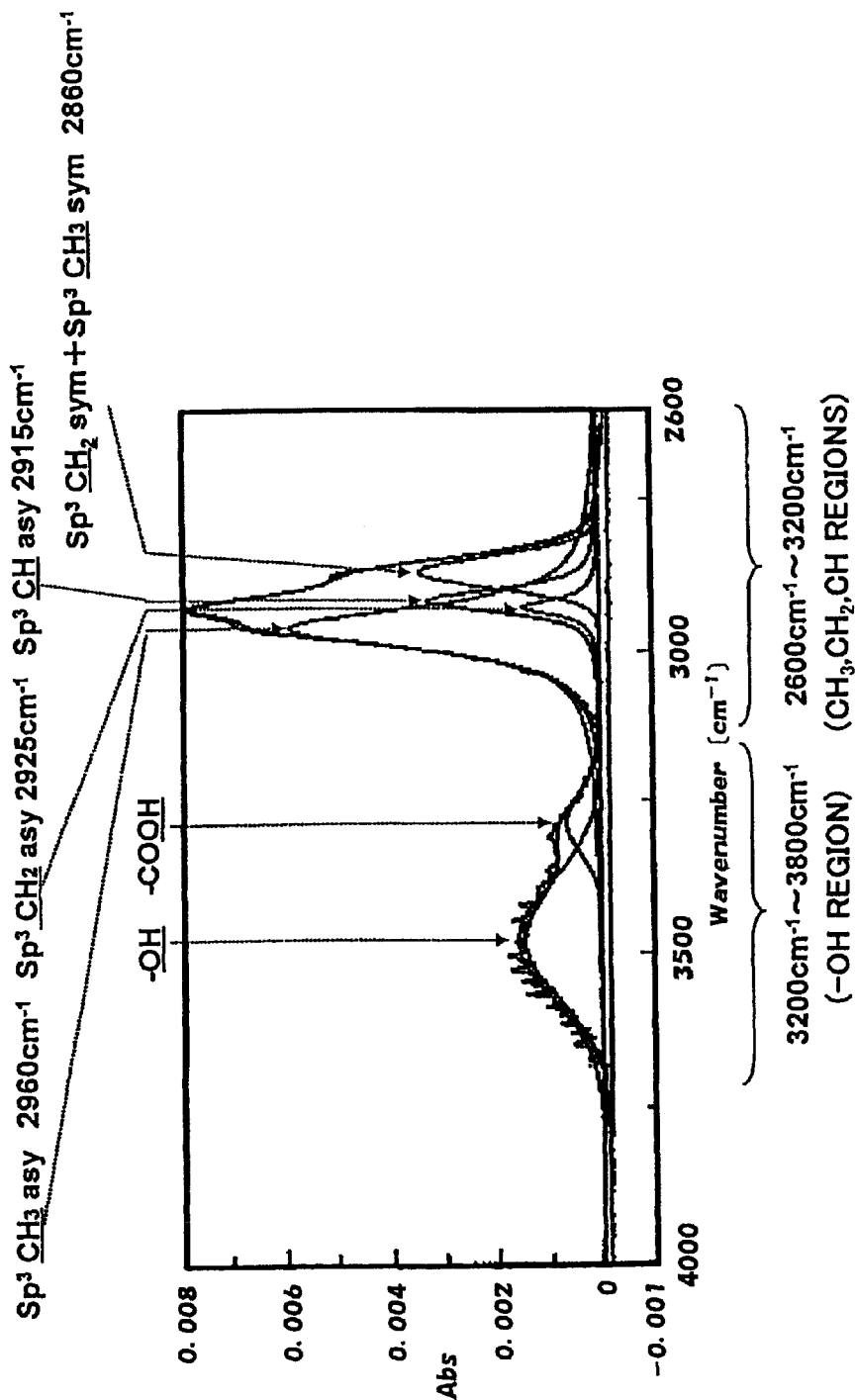

BIODEGRADABLE RESIN BOTTLE AND METHOD OF PRODUCING THE SAME

TECHNICAL FIELD

This invention relates to a biodegradable resin bottle and a method of producing the same. More specifically, the invention relates to a biodegradable bottle having a film vacuum-evaporated on the inner surface thereof by a plasma CVD method and a method of producing the same.

BACKGROUND ART

In order to improve properties of various base materials, attempts have heretofore been made to vacuum-evaporate a film on the surfaces thereof by a plasma CVD method. In the field of packing materials, it is a known practice to vacuum-evaporate a film on a plastic base material such as of a container by the plasma CVD method in order to improve gas shut-off property. For example, it has been attempted to improve gas-barrier properties by vacuum-evaporating silicon oxide film on the surface of a plastic container such as a polyethylene terephthalate (PET) bottle by the plasma CVD method.

In recent years, a polylactic acid which is a representative biodegradable plastic material is drawing attention in various fields from the standpoint of environmental problems. In the field of packing materials, too, bottles made from the polylactic acid have been put into practical use. The polylactic acid bottles are inferior in gas-barrier property to the PET bottles. Therefore, attempts have been made to vacuum-evaporate the film on the polylactic acid bottles, too, in order to improve gas-barrier property and the like properties.

Silicon oxide exhibits excellent gas-barrier property when it is vacuum-evaporated onto the PET bottles but invites various problems when it is vacuum-evaporated onto containers made from a resin having a low glass transition point and a low heat resistance, such as the polylactic acid. That is, the polylactic acid has a glass transition point (Tg) of 58° C. and is thermally inferior to PET (e.g., PET has a Tg of 70° C.). That is, in order to exhibit barrier property, the silicon oxide must be vacuum-evaporated under a high-output condition (usually, vacuum evaporation with a microwave output of not less than 600 W for not shorter than 4 sec) while using an oxygen gas and an organometal gas. When vacuum-evaporated under such a high-output condition, the wall of polylactic acid bottle is thermally deformed and thermally deteriorated due to the heat of oxygen plasma and other plasma occurring in the step of vacuum evaporation, and offensive odor generates in the bottle. Further, the vacuum-evaporated film of silicon oxide is hard, brittle and lacks flexibility, and forms a hydrophilic group such as silanol group. Therefore, the vacuum-evaporated film of silicon oxide poorly follows deformation of the polylactic acid base material, not so closely adheres thereto and, besides, exhibits low barrier property against water.

Under such circumstances, vacuum-evaporated films of other than the silicon oxide have been extensively studied. For example, patent documents 1 and 2 are proposing vacuum-evaporating a hydrocarbon film called diamond-like carbon film (DLC film) on the inner surfaces of the polylactic acid bottles. Further, a patent document 3 is proposing forming, on the surface of a plastic container, a DLC film (long-chain branched type) comprising amorphous carbon as a chief component, the compositions of $CH_3$, $CH_2$ and CH in the film being at a ratio of 25%, 60% and 15% based on the sum of these three components.

Patent document 1: JP-A-2001-18290
Patent document 2: JP-A-2005-14966
Patent document 3: JP-A-2006-131306

DISCLOSURE OF THE INVENTION

Problems to be Solved by the Invention

The hydrocarbon films proposed in the above prior arts can be vacuum-evaporated with low outputs and in short periods of time as compared to the silicon oxide film, offering an advantage in that the films can be formed on the inner surfaces of the polylactic acid bottles without causing the polylactic acid bottles to be thermally deformed or thermally deteriorated. Besides the films exhibit higher barrier property against water than that of the silicon oxide film.

However, the known hydrocarbon type vacuum-evaporated films proposed in the patent documents 1 to 3 are not still satisfactory concerning the barrier property against oxygen and the like, and are desired to be improved. For example, if a polylactic acid bottle having a hydrocarbon film vacuum-evaporated on the inner surface thereof is used for containing an oily content as represented by an edible oil such as frying oil, a problem occurs in that the oily content undergoes the deterioration by oxidation.

Oil is usually oxidized and deteriorated as an oxygen radical bonds to an unsaturated double bond of the oil forming a hydroperoxide which, then, decomposes into ketone and carboxylic acid to generate offensive odor. Therefore, the container for containing oils must have oxygen-barrier property. Besides, the oil absorbs moisture in the exterior forming micelle that often becomes cloudy. Therefore, oxygen-barrier property as well as water-barrier property are required for the products comprising oil only except those oily products that have been emulsified from the first time.

For example, the hydrocarbon type vacuum-evaporated film disclosed in the patent document 3 has the composition of $CH_3$, $CH_2$ and CH in the film at a ratio of 25%, 60% and 15% based on the sum of these three components. The above film is highly flexible and highly closely adheres. Therefore, when the vacuum-evaporated film is formed on the polylactic acid bottle, the film closely adheres thereto effectively avoiding the peeling of film. Still, however, the oxygen-barrier property is not satisfactory and cannot be applied to the polylactic acid bottle for containing the oily content.

Further, when the oily content is contained in the polylactic acid bottle having the known hydrocarbon type vacuum-evaporated film on the inner surface thereof and is left to stand in the open air, a problem occurs in that the vacuum-evaporated film tends to peel off. This tendency becomes conspicuous particularly when stored in a high-temperature and high-humidity atmosphere.

It is, therefore, an object of the present invention to provide a biodegradable resin bottle having a vacuum-evaporated film on the inner surface of the bottom wall, effectively preventing the thermal deformation of the bottle at the time of forming the film and exhibiting excellent barrier property against oxygen and water.

Another object of the present invention is to provide a biodegradable resin bottle effectively suppressing the peeling of vacuum-evaporated film even when the bottle is placed in the open air and, particularly, in a high-temperature and high-humidity atmosphere.

A further object of the invention is to provide a biodegradable resin bottle which, even when an oily content is contained therein, effectively prevents the deterioration by oxidation and stably maintains the quality of the oily content.

Means for Solving the Problem

According to the present invention, there is provided a biodegradable resin bottle having a wall formed by a biodegradable resin and a vacuum-evaporated film, formed by a plasma CVD method, on an inner surface of the wall,
wherein said vacuum-evaporated film (short-chain branched type) exhibits hydrocarbon peaks stemming from CH, $CH_2$ and $CH_3$ in a region of a wave number of 3200 to 2600 $cm^{-1}$ as measured by FT-IR, and per the sum of CH, $CH_2$ and $CH_3$ calculated from the hydrocarbon peaks, a $CH_2$ ratio is not larger than 35% and a $CH_3$ ratio is not smaller than 40%.

According to the invention, there is further provided a pack having an oily content contained in the biodegradable resin bottle.

Here, the oily content includes not only an oily substance alone but also the one containing an oil as well as water like an emulsified oil.

In the biodegradable resin bottle of the invention, it is desired that:
(1) The vacuum-evaporated film has a polar group;
(2) The vacuum-evaporated film exhibits a peak stemming from an OH group in a region of a wave number of 3200 to 3800 $cm^{-1}$ as measured by FT-IR; and
(3) The vacuum-evaporated film has a thickness in a range of 40 to 180 nm.

According to the present invention, there is further provided a method of producing a biodegradable resin bottle including steps of;
feeding, as a reaction gas, a mixed gas of a gas of at least one kind of hydrocarbon compound selected from an aliphatic unsaturated hydrocarbon and an aromatic hydrocarbon, and a gas of a polar group-containing organic compound; and
forming a hydrocarbon vacuum-evaporated film on an inner surface of the biodegradable resin bottle by a plasma CVD using microwaves or high-frequency waves.

In the production method of the invention, it is desired that:
(1) an oxygen-containing organic compound is used as the polar group-containing organic compound;
(2) any one of methanol, ethanol or acetone is used as the oxygen-containing organic compound;
(3) ethylene or acetylene is used as the hydrocarbon compound;
(4) the gas of the hydrocarbon compound and the gas of the polar group-containing organic compound are fed, as the reaction gas, at a flow rate ratio of 99:1 to 8:1; and
(5) film-forming time (vacuum-evaporating time) for the hydrocarbon vacuum-evaporated film is 0.5 to 5 seconds.

Effect of the Invention

In the present invention, the vacuum-evaporated film on the inner surface of the wall of the biodegradable resin bottle is a hydrocarbon film, and is formed in a short period of time by the plasma CVD. This makes it possible to effectively avoid the thermal deformation of the bottle at the time of forming the film on the inner surface of the wall of the biodegradable resin bottle having a low heat resistance like the polylactic acid that has a low glass transition point.

It is, further, important that the hydrocarbon vacuum-evaporated film has a composition containing a CH group, a $CH_2$ group and a $CH_3$ group at a predetermined ratio. That is, the above hydrocarbon vacuum-evaporated film exhibits peaks stemming from CH, $CH_2$ and $CH_3$ in the region of a wave number of 3200 to 2600 $cm^{-1}$ as measured by FT-IR. Reference should be made, for example, to FIG. 1 which is an FT-IR chart of a hydrocarbon vacuum-evaporated layer in the film formed on a polylactic acid base plate prepared by an Experimental Example appearing later. FIG. 1 shows a peak stemming from a $CH_3$ bond in an asymmetric oscillation mode at a wave number of 2960 $cm^{-1}$, a peak stemming from a $CH_2$ bond in an asymmetric oscillation mode at a wave number of 2925 $cm^{-1}$, and a peak stemming from a CH bond in an asymmetric oscillation mode at a wave number of 2915 $cm^{-1}$. According to the invention, attention is given to absorption peaks in the same asymmetric oscillation mode of the hydrocarbon vacuum-evaporated film, and a composition is obtained having a $CH_2$ ratio of not larger than 35% and a $CH_3$ ratio of not smaller than 40% as calculated based on the peak intensities (as for a detailed method of calculation, refer to Experimental Example). With the hydrocarbon film having the above composition being vacuum-evaporated on the inner surface of the biodegradable resin bottle, the barrier property against oxygen is greatly improved as compared to that of when a known DLC film is formed. Even when an oily content is contained, therefore, it is made possible to effectively prevent the deterioration of the oily content by oxidation.

Though the reason has not yet been correctly clarified why the hydrocarbon vacuum-evaporated film of the above composition helps improve the barrier property against oxygen, the inventors of the present invention presume it as described below.

That is, the fact that the $CH_2$ ratio and the $CH_3$ ratio that are within the above ranges means that the film has a suitable degree of flexibility, is formed by molecules having a branched structure, has a dense structure exhibiting, therefore, improved barrier property against oxygen, closely adheres to the inner surface of the wall of the biodegradable resin bottle, making it possible to effectively avoid the deterioration by oxidation not only when an aqueous content is contained but also when an oily content is contained, enabling the quality of the content to be stably maintained. For example, if the hydrocarbon type film proposed by the above patent document 3 is vacuum-evaporated on the inner surface of the wall of the polylactic acid bottle, the $CH_2$ ratio is larger than that of the present invention. Therefore, the film composition is not dense but is loose. As a result, though the film may closely adhere to a satisfactory degree, oxygen-barrier property is not obtained to a sufficient degree. Besides, the $CH_3$ ratio is low. The hydrocarbon type vacuum-evaporated film of a composition having, for example, a zero $CH_3$ ratio is devoid of flexibility and is very hard, and cannot follow the deformation of the bottle wall. Therefore, the film peels and barrier property is not obtained as desired.

Here, as described earlier, when the polylactic acid bottle having the known hydrocarbon type film vacuum-evaporated on the inner surface thereof and filled with an oily content is left to stand in the open air (particularly, in a high-temperature and high-humidity atmosphere), the problem arises in that the film tends to be easily peeled off. The peeling of the film is attributed to that the wall of the polylactic acid bottle has low barrier property against water whereas the hydrocarbon type film that is vacuum-evaporated has high barrier property against water. That is, due to the difference in the water vapor pressure between the interior of the bottle and the exterior of the bottle, the water component present in the air exterior of the bottle infiltrates through the wall of polylactic acid having low water-barrier property and is blocked by the vacuum-evaporated hydrocarbon type film having high water-barrier property. As a result, the water builds up in the interface between the hydrocarbon type vacuum-evaporated film and the wall of polylactic acid, and the film peels due to the water content that is built up. Therefore, the above peeling of film is a problem inherent in the polylactic acid bottles having low water-barrier property and having the hydrocarbon type film vacuum-evaporated on the inner surface thereof when they are filled with oily contents.

According to the present invention, on the other hand, a polar group such as OH group is introduced into the hydrocarbon vacuum-evaporated film to further improve the close adhesion between the vacuum-evaporated film and the inner surface of the bottle wall, making it possible to effectively prevent the problem of the peeling of film of when the oily content is contained in the biodegradable resin bottle having the hydrocarbon vacuum-evaporated film on the inner surface thereof. That is, the biodegradable resin such as the polylactic acid has a carbonyl group (>C=O) concentration higher than that of PET. Upon introducing the polar group as represented by the OH group into the film, a hydrogen bond is formed between the polar group and the carbonyl group enhancing the junction strength between the inner surface of the biodegradable resin wall and the vacuum-evaporated film. As a result, peeling of the vacuum-evaporated film is effectively avoided even when water has infiltrated into the interface between the inner surface of the bottle wall and the vacuum-evaporated film.

In the invention, further, it is desired that the hydrocarbon vacuum-evaporated film has a thickness in a range of 40 to 180 nm. That is, the hydrocarbon vacuum-evaporated film having the above composition is formed by the plasma CVD in a short period of time requiring an output which is smaller than that of when the silicon oxide film is formed but is larger than that of when the known hydrocarbon film is vacuum-evaporated. As a result, the hydrocarbon vacuum-evaporated film on the inner surface of the bottle wall according to the invention has a thickness as described above exhibiting excellent barrier property against oxygen and increased barrier property against water. That is, if the thickness is smaller than the above range, the barrier property is not obtained to a sufficient degree despite the CH, $CH_2$ and $CH_3$ ratios are in the above ranges, and the barrier property is impaired. If the thickness is larger than the above range, the film becomes hard and loses flexibility. Therefore, close adhesion is not attained to the inner surface of the bottle wall and barrier property may not be obtained as desired.

BRIEF DESCRIPTION OF THE DRAWING

FIG. 1 is an FT-IR chart of a hydrocarbon vacuum-evaporated film on the polylactic acid bottle of the present invention prepared in Example 1.

BEST MODE FOR CARRYING OUT THE INVENTION

The biodegradable resin bottle of the present invention has a hydrocarbon vacuum-evaporated film of a predetermined composition on the inner surface of the bottle wall of the biodegradable resin. As required, such vacuum-evaporated film may be further formed on the outer surface of the bottle wall.

<Biodegradable Resin>

As the biodegradable resin that constitutes the bottle wall in this invention, a polylactic acid is preferably used from the standpoint of general applicability in the field of packing materials. As the polylactic acid, there can be used either a poly-L-lactic acid or a poly-D-lactic acid, or a molten blend of poly-L-lactic acid and poly-D-lactic acid, or a copolymer thereof. Or, there may be used a copolymer thereof with glycolic acid which is a polyoxy acid that is biodegradable or caprolactone. Further, polyglycolic acid, cellulose acetate and polycaprolactone may be blended.

As described above, the biodegradable resin has a lower glass transition point (Tg) (generally, not higher than 60° C.) and a lower heat resistance than those of PET. Due to the heat of plasma at the time of forming the vacuum-evaporated film, therefore, the base material is subject to be thermally deformed or undergoing the deterioration by oxidation generating offensive taste and offensive odor. According to the present invention, however, the hydrocarbon vacuum-evaporated film of a composition that will be described later is vacuum-evaporated within short periods of time without using oxygen gas making it possible to effectively avoid the thermal deformation or deterioration of the base member by oxidation at the time of forming the film and, therefore, to obtain satisfactory barrier performance.

Further, the bottle is formed in the same manner as the known PET bottles but using the biodegradable resin. For example, a preform of the shape of a test tube is formed by extrusion-forming or injection-forming the biodegradable resin and is, next, blow-formed by using a blow metal mold to thereby obtain a biodegradable resin bottle on which the hydrocarbon type film is to be vacuum-evaporated. The blowing system may be either a biaxial draw-blow forming or a direct blow forming.

<Hydrocarbon Vacuum-Evaporated Film>

In this invention, the hydrocarbon vacuum-evaporated film is formed on the inner surface of the above biodegradable resin bottle by a plasma CVD using a reaction gas containing a predetermined compound gas, e.g., by a plasma CVD based on glow discharge by using microwaves or high-frequency waves.

When high-frequency waves are to be used, the bottle wall on which the film is to be formed must be held by a pair of electrode plates. It is, therefore, preferred to employ the plasma CVD based on microwaves to form the film without using electrode plates. This is because the device becomes complex in structure holding the bottle wall by using the pair of electrode plates.

According to the above plasma CVD, the biodegradable resin bottle on which the film is to be formed is placed in a chamber which maintains a predetermined degree of vacuum, the interior of the bottle is evacuated and a predetermined reaction gas is fed into the bottle in a state where a predetermined degree of vacuum is maintained, and microwaves are fed with a predetermined output to thereby form a film on the inner surface of the bottle wall. When high-frequency waves are to be employed, the bottle is held between the pair of electrodes, and the film is formed by feeding the reaction gas and applying the high-frequency waves of a predetermined output in the same manner as described above.

In this invention, the hydrocarbon vacuum-evaporated film is formed relying on the plasma CVD by using a gas of a hydrocarbon compound as the reaction gas, and contains carbon element (C) as a chief component. As described already, the film contains the CH bond, $CH_2$ bond and $CH_3$ bond, and is different from a composition of a hard diamond-like carbon film (DLC film) which does not almost contain the $CH_3$ bond. The presence of these bonds can be confirmed from peaks stemming from CH, $CH_2$ and $CH_3$ in a region of 3200 to 2600 $cm^{-1}$ as measured by FT-IR.

The ratio of the above bonds is calculated relying on a spectrum found from the FT-IR measurement, and is found from the values obtained by multiplying the peak intensities by absorption constant (absorptivity) to the absorption peaks. Concretely, the $CH_2$ ratio must be in a range of not larger than 35% and the $CH_3$ ratio must be in a range not smaller than 40% with respect to the total amount of the bonding components from the standpoint of barrier property. Owing to the above composition, the hydrocarbon vacuum-evaporated film exhibits a suitable degree of flexibility, closely adheres to the inner surface of the bottle wall made from the biodegradable resin, has a dense structure, exhibits excellent barrier property against oxygen, etc. and, further, exhibits high barrier property against water. In this invention, in particular, it is desired that the $CH_2$ ratio is not larger than 35% and the $CH_3$ ratio is not smaller than 40%, preferably, the $CH_2$ ratio is not larger than 30% and the $CH_3$ ratio is not smaller than 45%, and particularly preferably, the $CH_2$ ratio is not larger than 20% and the $CH_3$ ratio is not smaller than 55% from the standpoint of exhibiting excellent barrier property against oxygen and water. The relative ratios of CH, $CH_2$ and $CH_3$ are that the CH ratio is in a range of 10 to 40%, the $CH_2$ ratio is in a range of 0 to 35%, and the $CH_3$ ratio is in a range of 40 to 90%, more preferably, the CH ratio is in a range of 10 to 40%, the $CH_2$ ratio is in a range of 0 to 30%, and the $CH_3$ ratio is in a range of 45 to 90%, and further preferably, the CH ratio is in a range of 10 to 40%, the $CH_2$ ratio is in a range of 0 to 20%, and the $CH_3$ ratio is in a range of 55 to 90%.

In this invention, further, it is desired that a polar group is introduced into the hydrocarbon vacuum-evaporated film. That is, upon introducing the polar group into the film, a hydrogen bond is formed between the polar group and the carbonyl group included in the polylactic acid forming the bottle wall, whereby the junction strength increases between the film and the bottle wall, and the vacuum-evaporated film is effectively prevented from being peeled off even if water infiltrates from the atmosphere in which the bottle is preserved and builds up in the interface between the two.

Any polar group can be used provided it is capable of forming the hydrogen bond between itself and a carbonyl group in the biodegradable resin such as polylactic acid, and there can be exemplified hydroxyl group, amino group, amido group, carboxyl group and ester group. Among them, however, the hydroxyl group (OH) group is most desired since it does not decompose in the film and can be easily introduced into the film. The presence of the polar group can be easily confirmed by the FT-IR measurement. For example, the OH group exhibits an absorption peak in a region of a wave number of 3200 to 3800 $cm^{-1}$. In forming the film, the polar group can be easily introduced by using, in combination, a polar group-containing organic compound or a compound that forms a polar group by the reaction for forming the film.

Further, the above hydrocarbon vacuum-evaporated film has a thickness in a range of 40 to 180 nm and, preferably, 60 to 160 nm. That is, if the thickness is smaller than the above range, it becomes difficult to maintain predetermined oxygen-barrier property. If the thickness is larger than the above range, the vacuum-evaporated film itself exhibits increased rigidity and becomes no longer capable of following deformation of the bottle in case the bottle is deformed. Therefore, the film cracks or peels off resulting in a decrease in the barrier property.

<Film-Forming Conditions>

In this invention, the hydrocarbon vacuum-evaporated film is formed by using a hydrocarbon compound. There is no particular limitation on the hydrocarbon compound provided it can be easily gasified, and a variety kinds of hydrocarbon compounds can be used. From the standpoint of easy gasification, for instance, unsaturated aliphatic hydrocarbons and aromatic hydrocarbons can be favorably used. Concrete examples of the unsaturated aliphatic hydrocarbon will include alkenes such as ethylene, propylene, butene and pentene; alkynes such as acetylene and methylacetylene; alkadienes such as butadiene and pentadiene; and cycloalkenes such as cyclopentene and cyclohexene, while concrete examples of the aromatic hydrocarbon will include benzene, toluene, xylene, indene, naphthalene and phenanthrene. Here, however, unsaturated aliphatic hydrocarbons are preferably used, and ethylene and acetylene are particularly preferably used.

To introduce the polar group into the hydrocarbon vacuum-evaporated film, a gas of the above hydrocarbon compound is used in combination with a gas of a polar group-containing organic compound or of a compound that generates polar groups at the time of forming the film. The mixed gas thereof is used as a reaction gas, and the film is formed by the plasma CVD. As the compound used for introducing the polar group, there can be concretely exemplified various alcohols or phenols, amines, amides, carboxylic acids, and esters, or ketones that form OH groups upon the reaction in forming the film. Or, the OH groups can be introduced by using a carbonic acid gas. Particularly, it is desired to use an oxygen-containing organic compound, especially methanol, ethanol, acetone or carbonic acid gas from the standpoint of easy gasification, inexpensive cost, and efficient introduction of the hydroxyl groups.

When the plasma CVD is carried out by using a reaction gas of the above mixture of the gas of the polar group-containing organic compound and the gas of the hydrocarbon compound, it is desired that the gas of the hydrocarbon compound and the gas of the polar group-containing organic compound are fed at a flow rate ratio of 99:1 to 8:1. If the flow rate of the polar group-containing organic compound is small, the junction strength of the vacuum-evaporated film is not improved by the introduction of polar groups to a sufficient degree, and it becomes difficult to effectively suppress the problem of peeling of film caused by the infiltration and build up of water. If the polar group-containing organic compound is used in excess amounts, on the other hand, the barrier property of the hydrocarbon type vacuum-evaporated film against oxygen and water may decrease due to excess introduction of the polar groups.

In the invention, a gas of the above hydrocarbon compound is used as the reaction gas, or a mixed gas of the gas of the hydrocarbon compound and a gas of the polar group-containing organic compound is used as the reaction gas, and the plasma CVD is conducted relying on a glow discharge by using microwaves or high-frequency waves to thereby obtain a desired hydrocarbon type vacuum-evaporated film. To obtain the above-mentioned composition, however, the plasma CVD must be effected relying on the glow discharge using microwaves or high-frequency waves of a relatively high output as compared to that of forming the known hydrocarbon type vacuum-evaporated film. Concretely, the microwave and high-frequency outputs should be both not lower than 450 W. In the case of microwaves, the output is, preferably, not lower than 500 W but not higher than 1200 W and, more preferably, not lower than 600 W but not higher than 900 W. In the case of high-frequency waves, the output is, preferably, 450 to 950 W. That is, if the output is low, the $CH_2$ ratio becomes larger than the above range. As a result, a dense layer is not formed, and the barrier property against oxygen and water is not satisfactory. If the output is unnecessarily increased, the vacuum-evaporated film becomes very hard, no longer closely adheres to the bottle wall and exhibits unsatisfactory barrier property against oxygen and water. It is, therefore, desired that the microwave and high-frequency outputs are in the above ranges.

In this invention, further, when the mixed gas of the gas of the hydrocarbon compound and the gas of the polar group-containing organic compound is used as the reaction gas to introduce polar groups into the film, the plasma CVD may be so conducted that the output is low at first and becomes relatively high as described above toward the end. That is, when the film is formed by the plasma CVD with a low output, the polar groups are suppressed from being decomposed and, as a result, the film has a structure in which polar groups such as OH groups are much distributed on the surface side of the bottle wall, whereby most of the polar groups present in the film contribute to forming hydrogen bonds with the biodegradable resin that constitutes the bottle wall, effectively improving the junction strength between the hydrocarbon type vacuum-evaporated film and the bottle wall. The output in the initial step is, usually, about 420 to about 600 W when either microwaves or high-frequency waves are used.

In this invention, the plasma reaction is conducted based on the glow discharge using microwaves or high-frequency waves of a relatively high output as described above, and it is desired that the film-forming time is in a range of 0.5 to 5 seconds. When the microwaves are used, in particular, the film-forming time is, preferably, in a range of 1 to 4 seconds and when the high-frequency waves are used, the film-forming time is, particularly preferably, in a range of 1 to 4 seconds. This is because if the film-forming time becomes too long, the vacuum-evaporated film becomes hard, no longer closely adheres to the bottle wall, and tends to exhibit decreased barrier property against oxygen and water. Further, when the initial output is set to be low to introduce polar groups, the plasma CVD needs be conducted for only a short period of time with the low output, and the whole time for forming the film may be set to lie in the above-mentioned range.

In this invention, the plasma CVD is conducted by using microwaves or high-frequency waves of an output in the above range and the film-forming time is set as described above. Therefore, the CH, $CH_2$ and $CH_3$ ratios lie in the above-mentioned ranges, the hydrocarbon vacuum-evaporated film is formed having a thickness lying in the above-mentioned range, polar groups are introduced in a predetermined amount therein, and the hydrocarbon vacuum-evaporated film is strongly joined to the bottle wall.

In forming the hydrocarbon vacuum-evaporated film as described above, the reaction gas (hydrocarbon gas) is fed at a rate in a range of 10 to 100 sccm to the plasma CVD which uses microwaves or high-frequency waves, and the reaction is conducted with the above output in the above time for forming the film while adjusting the gas flow rate within the above range. This makes it possible to so adjust the composition that the CH, $CH_2$ and $CH_3$ ratios lie in the above-mentioned ranges. Here, "sccm" stands for a standard cubic centimeter per minute at 0° C. under 1 atmosphere.

In the invention which thus forms the film, the film-forming time is short, and the bottle wall is not thermally deformed or thermally deteriorated in forming the film.

The biodegradable resin bottle of the present invention has the hydrocarbon vacuum-evaporated film formed thereon as described above, exhibits higher barrier property against oxygen and water than that of the conventional bottles having the DLC film vacuum-evaporated thereon, and exhibits particularly high barrier property against oxygen. Therefore, the biodegradable bottle of the present invention helps maintain high quality not only when aqueous contents are contained such as various kinds of juices or water but also when oily contents are contained. In particular, the bottle of the invention effectively prevents deterioration by oxidation even when oils that easily oxidize and deteriorate are contained, such as fry oil, sesame oil and rape oil. The biodegradable resin bottle of the present invention can also be used for containing hair-washing agent containing oils, such as shampoo, or an oily content containing water, such as emulsion type dressing.

Further, the hydrocarbon vacuum-evaporated film to which polar groups are introduced is effectively prevented from being peeled off despite water has infiltrated and built up due to a vapor pressure differential between the interior and the exterior of the bottle. Therefore, the bottle can be very effectively used for containing oily content without containing water.

EXAMPLES

Next, the invention will be described by way of Examples.

Described below are the method of producing the vacuum-evaporated PLA bottles, method of evaluating properties of the bottles and method of analyzing the vacuum-evaporated films used in the following Examples and Comparative Examples.

(Bottles for Vacuum Evaporation Testing)

Use was made of polylactic acid bottles (PLA bottles) having a content of 400 ml obtained by biaxially draw-blow-forming preforms made from a polylactic acid (PLA) resin.

(Vacuum Evaporation Treatment)

Vacuum evaporation (film-forming) was effected by the plasma CVD in a customary manner. A plastic container on which a film is to be formed was held in a chamber maintaining a predetermined degree of vacuum, a test gas was fed therein and predetermined microwaves were fed to prepare a film. As the starting gas, acetylene was introduced at a rate of 30 sccm into the plastic container, and microwaves of 2.45 GHz were output for 0.5 to 5 seconds to form a hydrocarbon type film. Similarly, a mixed gas of acetylene and an oxygen-containing organic carbon gas (ethanol/methanol/acetone) was used (total flow rate of 30 sccm), and microwaves of 2.45 GHz were output to form a film. After the films were formed, the bottle was released to the open air and was taken out from the vacuum-evaporating device to thereby obtain a vacuum-evaporated PLA bottle.

Compositions of test gases used for the experiments were as described in Experimental Examples.

[Evaluation of Vacuum-Evaporated Bottles]

(Oxygen-Barrier Property)

The vacuum-evaporated PLA bottle was introduced into a globe box (vacuum-gas substitution apparatus, model SGV-80) manufactured by AS ONE Co., and the interior thereof was substituted with a nitrogen gas, sealed with a rubber plug and was preserved in an environment of 37° C. and 25% RH for 7 days. Next, 1 ml of gas in the container was picked up by using a gas-tight syringe, measured for its oxygen concentration by gas chromatography for measuring oxygen concentration, and was calculated per the surface area of the container to find an amount of oxygen permeation per day (cc/$m^2 \cdot$day). The allowable range of oxygen-barrier property is not larger than 12 cc/$m^2 \cdot$day.

(Evaluation of Peroxide Value)

The vacuum-evaporated PLA bottles were each filled with 390 g of a commercially available edible oil (initial peroxide value of 0.3 meq/kg) and were sealed with caps. Under a condition of 23° C. and 45% RH, the bottles were preserved for three months while being irradiated with a fluorescent lamp of 1200 luxes for 10 hours a day. After preserved, the test edible oils were picked up and measured for their peroxide values (meq/kg). The allowable range of peroxide value is not larger than 5 meq/kg.

The peroxide value was measured in compliance with the "Reference Oils and Fats Analyzing Method, 2.4.12-86 Peroxide Value, March, 1978" established by the Japanese Foundation of Oil Chemistry.

(Water-Barrier Property)

The vacuum-evaporated PLA bottle was filled with 400 ml of ion-exchanged water at room temperature, sealed with a rubber plug and was measured for its weight. After preserved at 40° C. and 90% RH for 7 days, the weight was measured again and was calculated per the surface area of the container to find an amount of water permeation per day ($g/m^2 \cdot day$). The allowable range of water-barrier property is not larger than 6 $g/m^2 \cdot day$.

(Oil Cloudy Testing)

The vacuum-evaporated PLA bottles were each filled with 390 g of a commercially available edible oil (initial water content of 145 ppm) and were capped. Under the condition of 40° C. and 90% RH, the bottles were preserved for 60 days and were, thereafter, left to stand at room temperature of 22° C. for 6 hours to observe the contained oils by eyes. In case the contained oils were cloudy as a result of absorbing water, it was so judged that the bottles lacked practicable water-barrier property and the bottles were evaluated to be "X". On the other hand, the bottles that did not become cloudy were so judged as to maintaining practicable water-barrier property and were evaluated to be "◯". The containers for containing oily contents must be evaluated to be "◯".

(Total Evaluation)

Based on the evaluations in the above tests, the bottle was totally evaluated to be "◯" when the oxygen-barrier property was not larger than 12 $cc/m^2 \cdot day$, the peroxide value was not larger than 5 meq/kg, the water-barrier property was not larger than 6 $g/m^2 \cdot day$ and when the oil cloudy test was evaluated to be "◯". On the other hand, when the conditions were not satisfied concerning any one of the above five items, the bottle was totally evaluated to be "X".

(Analysis of Hydrocarbon Type Vacuum-Evaporated Film)

—Preparation of Samples for Measurement—

The vacuum-evaporated PLA bottle was filled with chloroform and was shaken. Thereafter, the chloroform was recovered and filtered through a 5A-filtering paper. Next, the filtered residue was washed with an excess amount of chloroform. Next, the residue was isolated with chloroform and was recovered. The vacuum-evaporated film dispersed in chloroform was dropped on a KRS-5 plate and was dried.

—FT-IR Measurement—

By using a microscopic infrared FT-IR apparatus (FT/IR 6300 manufactured by Nihon Bunko Co.), measurement was taken (frequency range of measurement: 600 $cm^{-1}$ to 4000 $cm^{-1}$) based on a transmission method.

From a range of 2600 $cm^{-1}$ to 3200 $cm^{-1}$ to which the measured spectrum after corrected by the base line has attributed based on a document (B. Dischler, E-Mas Meeting, June, 1987, Vol. XVII, 189), a $CH_3$ absorption band (2960 $cm^{-1}$), a $CH_2$ absorption band (2925 $cm^{-1}$) and a CH absorption band (2915 $cm^{-1}$) were selected as absorption peaks in the asymmetric oscillation mode. From the standpoint of separating the waveforms, further, an absorption band ($CH_2+CH_3$ mixed absorption band; 2860 $cm^{-1}$) in the symmetric oscillation mode was used, and a curve was fitted from a synthetic function of Gauss function and Lorentz function based on the nonlinear method of least squares by using a curve-fitting software attached to the microscopic infrared FT-IR apparatus.

Peak intensities of the $CH_3$ absorption band (2960 $cm^{-1}$), $CH_2$ absorption band (2925 $cm^{-1}$) and CH absorption band (2915 $cm^{-1}$) in the asymmetric oscillation mode were multiplied by the coefficients of absorbance, i.e., by 0.31 (2960 $cm^{-1}$), 0.29 (2925 $cm^{-1}$) and 0.14 (2915 $cm^{-1}$) to regard them as amounts of structural components (reference document: Polymer Analytical Handbook).

For the peak intensities corrected by using the coefficients of absorbance, the sum of the $CH_3$ absorption band (2960 $cm^{-1}$), $CH_2$ absorption band (2925 $cm^{-1}$) and CH absorption band (2915 $cm^{-1}$) was set to be 100, and the structural component ratios of $CH_3$, $CH_2$ and CH were found according to the following formulas.

Here, in order to relatively compare the amounts of $CH_3$, $CH_2$ and CH components, attention was given to the asymmetric oscillation in which the constituent carbon atoms could be all observed. Attention was, further, given to the asymmetric oscillation since the intensity of $CH_2$ peak in the symmetric oscillation mode can be usually more vividly observed than the intensity of peak in the asymmetric oscillation mode. Therefore, the absorption band ($CH_2+CH_3$ mixed absorption band; 2860 $cm^{-1}$) in the symmetric oscillation mode was deleted from the calculation.

$$CH_3(\%) = I(CH_3) \times 100 / \{I(CH_3) + I(CH_2) + I(CH)\}$$

$$CH_2(\%) = I(CH_2) \times 100 / \{I(CH_3) + I(CH_2) + I(CH)\}$$

$$CH_1(\%) = I(CH_1) \times 100 / \{I(CH_3) + I(CH_2) + I(CH)\}$$

$I(CH_3) = (CH_3: 2960\ cm^{-1})$ curve-fitting value×coefficient of absorbance (0.31)

$I(CH_2) = (CH_2: 2925\ cm^{-1})$ curve-fitting value×coefficient of absorbance (0.29)

$I(CH) = (CH: 2915\ cm^{-1})$ curve-fitting value×coefficient of absorbance (0.14)

The OH infrared absorption peaks of 3200 $cm^{-1}$ to 3800 $cm^{-1}$ were not corrected by the coefficients of absorbance but instead, the absorbed peak intensities were used. The sum of peak intensities of (2800 $cm^{-1}$ to 3200 $cm^{-1}$) and peak intensities of (3200 $cm^{-1}$ to 3800 $cm^{-1}$) was set to be the denominator and peak intensities of (3200 $cm^{-1}$ to 3800 $cm^{-1}$) were set to be the numerators to calculate relative amounts of OH groups in percent.

(Measuring the Film Thickness)

In vacuum-evaporating the PLA bottles, silicon wafer pieces of 20 mm×20 mm were introduced onto the inner surfaces of the bottles and on which films were vacuum-evaporated according to Experimental Examples. Next, the reflection intensities of X-rays were measured by using a grazing incidence X-ray measuring apparatus (thin film X-ray analyzer, X'Pert PROMRD manufactured by PANalytical Co.), by using a CuK α-ray and scanning the angle of incidence (step: 0.003°) over angles of incidence of 0.1° to 2.5°. A curve of measured reflection of X-rays was analyzed by using a WinGixa software attached to the X-ray apparatus to find the thickness of the film.

Examples 1 to 11

Comparative Examples 1 and 2

By using the PLA bottles described above for testing the vacuum evaporation, films were vacuum-evaporated in accordance with the method described above by employing the film-forming conditions shown in Tables 1 and 2 to obtain the vacuum-evaporated PLA bottles.

The obtained bottles were evaluated concerning the above-mentioned various properties to obtain results as shown in Tables 1 and 2. FIG. 1 is an FT-IR chart of the hydrocarbon vacuum-evaporated film formed on the PLA bottle of Example 6.

an output of 615 W, and forming a film by effecting the vacuum evaporation (film-forming) for 3 seconds. The bottle was evaluated to be favorable concerning oxygen-barrier property, peroxide value, water-barrier property and oil cloudy testing.

TABLE 1

| Condition | Blank 1 PLA | Ex. 1 PLA | Ex. 2 PLA | Ex. 3 PLA | Ex. 4 PLA | Ex. 5 PLA | Ex. 6 PLA | Ex. 7 PLA | Ex. 8 PLA |
|---|---|---|---|---|---|---|---|---|---|
| Hydrocarbon vacuum-evaporated layer | | | | | | | | | |
| Acetylene gas (SCCM) | 0 | 30 | 30 | 30 | 29.7 | 28.8 | 26.7 | 26.7 | 26.7 |
| Ethanol gas (SCCM) | 0 | 0 | 0 | 0 | 0.3 | 1.2 | 3.3 | 0 | 0 |
| Methanol gas (SCCM) | 0 | 0 | 0 | 0 | 0 | 0 | 0 | 3.3 | 0 |
| Acetone gas (SCCM) | 0 | 0 | 0 | 0 | 0 | 0 | 0 | 0 | 3.3 |
| Microwave output (W) | — | 615 | 600 | 545 | 615 | 615 | 615 | 615 | 615 |
| Time for vacuum evaporation (sec) | — | 3 | 3 | 3 | 3 | 3 | 3 | 3 | 3 |
| Film thickness (nm) | — | 135 | 130 | 138 | 133 | 132 | 130 | 135 | 133 |
| Structural % $CH^3$ | — | 75 | 50 | 43 | 73 | 74 | 72 | 74 | 72 |
| Structural % $CH^2$ | — | 4 | 24 | 32 | 5 | 5 | 5 | 5 | 4 |
| Structural % CH | — | 21 | 26 | 25 | 22 | 21 | 23 | 21 | 24 |
| (3200-3800 $cm^{-1}$)/ (2800-3800 $cm^{-1}$) | — | 0 | 0 | 0 | 5 | 19 | 31 | 32 | 32 |
| Oxygen barrier (cc/$m^2$ · day) | 55 | 4.2 | 6.0 | 8.5 | 4.4 | 5.1 | 6.7 | 6.3 | 6.4 |
| Peroxide value (meq/Kg) | 11.2 | 0.49 | 0.72 | 1.47 | 0.53 | 0.66 | 0.96 | 0.90 | 0.92 |
| Water barrier (g/$m^2$ · day) | 13.0 | 1.4 | 3.0 | 5.7 | 1.5 | 1.9 | 4.5 | 4.2 | 3.8 |
| Oil cloudy testing | X | ◯ | ◯ | ◯ | ◯ | ◯ | ◯ | ◯ | ◯ |
| Total judgment | X | ◯ | ◯ | ◯ | ◯ | ◯ | ◯ | ◯ | ◯ |

TABLE 2

| Condition | Ex. 9 PLA | Ex. 10 PLA | Ex. 11 PLA | Comp. Ex. 1 PLA | Comp. Ex. 2 PLA |
|---|---|---|---|---|---|
| Hydrocarbon vacuum-evaporated layer | | | | | |
| Acetylene gas (SCCM) | 30 | 30 | 28.8 | 30 | 28.8 |
| Ethanol gas (SCCM) | 0 | 0 | 1.2 | 0 | 1.2 |
| Methanol gas (SCCM) | 0 | 0 | 0 | 0 | 0 |
| Acetone gas (SCCM) | 0 | 0 | 0 | 0 | 0 |
| Microwave output (W) | 615 | 615 | 545 | 340 | 340 |
| Time for vacuum evaporation (sec) | 0.5 | 5 | 3 | 3 | 3 |
| Film thickness (nm) | 40 | 180 | 130 | 135 | 128 |
| Structural % $CH^3$ | 73 | 75 | 43 | 34 | 33 |
| Structural % $CH^2$ | 4 | 4 | 30 | 42 | 43 |
| Structural % CH | 23 | 21 | 27 | 24 | 24 |
| (3200-3800 $cm^{-1}$)/ (2800-3800 $cm^{-1}$) | 0 | 0 | 19 | 0 | 16 |
| Oxygen barrier (cc/$m^2$ · day) | 6.2 | 3.0 | 8.8 | 32 | 36 |
| Peroxide value (meq/Kg) | 0.82 | 0.35 | 1.68 | 7.86 | 7.96 |
| Water barrier (g/$m^2$ · day) | 3.5 | 1.1 | 5.7 | 9.5 | 10.3 |
| Oil cloudy testing | ◯ | ◯ | ◯ | X | X |
| Total judgment | ◯ | ◯ | ◯ | X | X |

The following facts are understood from Tables 1 and 2.

As represented by Blank 1, a PLA bottle without vacuum-evaporated film could attain none of desired oxygen-barrier property, peroxide value, water-barrier property or oil cloudy testing.

In Example 1, a vacuum-evaporated PLA bottle was prepared by using an acetylene gas alone, using microwaves of an output of 615 W, and forming a film by effecting the vacuum evaporation (film-forming) for 3 seconds. The bottle was evaluated to be favorable concerning oxygen-barrier property, peroxide value, water-barrier property and oil cloudy testing.

In Examples 2 and 3, vacuum-evaporated PLA bottles were prepared in the same manner as in Example 1 but setting the microwave output to be 600 W and 545 W, respectively. The bottles were evaluated to be favorable concerning oxygen-barrier property, peroxide value, water-barrier property and oil cloudy testing.

In Examples 4 to 6, vacuum-evaporated PLA bottles were prepared in the same manner as in Example 1 but using a mixed gas of an acetylene gas and an ethanol gas, and setting their flow rate ratios to be 99:1, 24:1 and 8.1:1. In the FT-IR measurement, a peak stemming from the OH group was observed. The bottles were evaluated to be favorable concerning oxygen-barrier property, peroxide value, water-barrier property and oil cloudy testing.

In Example 7, a vacuum-evaporated PLA bottle was prepared in the same manner as in Example 1 but using a mixed gas of an acetylene gas and a methanol gas, and setting the flow rate ratio to be 8.1:1. In Example 8, a vacuum-evaporated PLA bottle was prepared in the same manner as in Example 1 but using a mixed gas of an acetylene gas and an acetone gas, and setting the flow ratio to be 8.1:1. In the FT-IR measurement, a peak stemming from the OH group was observed. The bottles were evaluated to be favorable concerning oxygen-barrier property, peroxide value, water-barrier property and oil cloudy testing.

In Examples 9 and 10, vacuum-evaporated PLA bottles were prepared in the same manner as in Example 1 but setting the time for plasma vacuum evaporation to be 0.5 seconds and 5 seconds, respectively, and vacuum-evaporating the films to possess thicknesses of 40 nm and 180 nm, respectively. The bottles were evaluated to be favorable concerning oxygen-barrier property, peroxide value, water-barrier property and oil cloudy testing.

In Example 11, a vacuum-evaporated PLA bottle was prepared in the same manner as in Example 3 but using a mixed gas of an acetylene gas and an ethanol gas, and setting the flow rate ratio to be 24:1. In the FT-IR measurement, a peak stemming from the OH group was observed. The bottle was evaluated to be favorable concerning oxygen-barrier property, peroxide value, water-barrier property and oil cloudy testing.

In Comparative Example 1, a vacuum-evaporated PLA bottle was prepared in the same manner as in Example 1 but setting the microwave output to be 340 W. The bottle was defective concerning all of oxygen-barrier property, peroxide value, water-barrier property and oil cloudy testing.

In Comparative Example 2, a vacuum-evaporated PLA bottle was prepared in the same manner as in Example 1 but using a mixed gas of an acetylene gas and an ethanol gas, setting the flow rate ratio to be 24:1, and setting the microwave output to be 340 W. The bottle was defective concerning all of oxygen-barrier property, peroxide value, water-barrier property and oil cloudy testing.

The invention claimed is:

1. A biodegradable resin bottle having a wall formed by a biodegradable resin and a vacuum-evaporated film, formed by a plasma CVD method, on an inner surface of the wall,
   wherein said vacuum-evaporated film exhibits hydrocarbon peaks stemming from CH, $CH_2$ and $CH_3$ in a region of a wave number of 3200 to 2600 $cm^{-1}$ as measured by FT-IR, and per the sum of CH, $CH_2$ and $CH_3$ calculated from the hydrocarbon peaks, a $CH_2$ ratio is not larger than 35% and a $CH_3$ ratio is not smaller than 40%;
   the vacuum-evaporated film exhibits, as measured by FT-IR, a peak stemming from an OH group in a region of a wave number of 3200 to 3800 $cm^{-1}$; and
   the biodegradable resin is a polylactic acid.

2. The bottle according to claim 1, wherein said vacuum-evaporated film has a thickness in a range of 40 to 180 nm.

3. A pack having an oily content contained in the bottle of claim 1.

4. A method of producing a biodegradable resin bottle including steps of;
   feeding, as a reaction gas, a mixed gas of a gas of at least one kind of hydrocarbon compound selected from an aliphatic unsaturated hydrocarbon and an aromatic hydrocarbon, and a gas of a polar group-containing organic compound; and
   forming a hydrocarbon vacuum-evaporated film on an inner surface of the biodegradable resin bottle by a plasma CVD using microwaves or high-frequency waves;
   wherein the biodegradable resin is a polylactic acid;
   wherein the polar-group containing organic compound being methanol, ethanol or acetone; and
   wherein the vacuum-evaporation by plasma CVD is carried out so as to obtain vacuum-evaporated film which exhibits hydrocarbon peaks stemming from CH, $CH_2$ and $CH_3$ in a region of a wave number of 3200 to 2600 $cm^{-1}$ and an OH peak stemming from an OH group in a region of a wave number of 3200 to 3800 $cm^{-1}$ as measured by FT-IR, the $CH_2$ ratio being not larger than 35% and the $CH_3$ ratio being not smaller than 40% per the sum of CH, $CH_2$, $CH_3$ calculated from the hydrocarbon peaks.

5. The production method according to claim 4, wherein ethylene or acetylene is used as said hydrocarbon compound.

6. The production method according to claim 4, wherein the gas of said hydrocarbon compound and the gas of said polar group-containing organic compound are fed, as the reaction gas, at a flow rate ratio of 99:1 to 8:1.

7. The production method according to claim 4, wherein film-forming time for the hydrocarbon vacuum-evaporated film is 0.5 to 5 seconds.

* * * * *